US010581376B2

(12) United States Patent
Joardar (10) Patent No.: US 10,581,376 B2
(45) Date of Patent: Mar. 3, 2020

(54) METHOD AND APPARATUS FOR A SOLAR PANEL

(71) Applicant: Tiasha Joardar, Plano, TX (US)

(72) Inventor: Tiasha Joardar, Plano, TX (US)

(*) Notice: Subject to any disclaimer, the term of this patent is extended or adjusted under 35 U.S.C. 154(b) by 201 days.

(21) Appl. No.: 15/604,306

(22) Filed: May 24, 2017

(65) Prior Publication Data

US 2018/0342978 A1    Nov. 29, 2018

(51) Int. Cl.
| | | |
|---|---|---|
| *H02S 40/42* | (2014.01) | |
| *H02J 3/14* | (2006.01) | |
| *H02J 3/46* | (2006.01) | |
| *H02J 3/38* | (2006.01) | |
| *H01L 35/28* | (2006.01) | |
| *H02S 40/30* | (2014.01) | |
| *H02S 50/00* | (2014.01) | |

(52) U.S. Cl.
CPC .............. *H02S 40/42* (2014.12); *H01L 35/28* (2013.01); *H02J 3/14* (2013.01); *H02J 3/383* (2013.01); *H02J 3/46* (2013.01); *H02S 40/30* (2014.12); *H02S 50/00* (2013.01)

(58) Field of Classification Search
CPC ......... H02S 40/42; H02S 40/30; H01L 35/28; H02J 3/14; H02J 3/383; H02J 3/46
See application file for complete search history.

(56) References Cited

U.S. PATENT DOCUMENTS

| | | | |
|---|---|---|---|
| 6,806,415 B2 | 10/2004 | Fujisaki et al. | |
| 8,646,281 B2 | 2/2014 | Lim | |
| 8,667,806 B2 | 3/2014 | Sinha | |
| 9,130,503 B2* | 9/2015 | Vandermeulen | ........ H02S 40/44 |
| 9,647,495 B2* | 5/2017 | Bonicatto | ................ H02J 3/14 |
| 10,139,846 B2* | 11/2018 | Motsenbocker | .......... G05F 1/67 |
| 2015/0277410 A1* | 10/2015 | Gupta | ..................... H02J 3/008 |
| | | | 700/295 |
| 2015/0326019 A1* | 11/2015 | Wei | ......................... H02J 3/383 |
| | | | 307/80 |
| 2017/0085093 A1* | 3/2017 | Arditi | ............... H01L 31/02021 |

* cited by examiner

*Primary Examiner* — Michael C Zarroli
(74) *Attorney, Agent, or Firm* — Ariel S. Bentolia; Bay Area IP Group, LLC (57) ABSTRACT

A system comprises a smart hybrid solar panel that employs a self-powered adaptive temperature control. Active temperature regulation may be implemented using a heat pump such as thermoelectric (TE) cooling modules and a switching circuit with variable duty cycle that periodically diverts the photovoltaic solar cell's output to the heat pump. A control system may algorithmically adjust the switching duty cycle to maximize the net power output of the panel based on a variety of sensory inputs and/or algorithms. The variety of sensory inputs may include weather forecast information, internal panel temperature, ambient air temperature, panel output voltage and current and humidity. The photovoltaic solar cells and heat pump are mechanically integrated.

12 Claims, 6 Drawing Sheets

METHOD AND APPARATUS FOR A SOLAR PANEL

CROSS-REFERENCE TO RELATED APPLICATIONS

Not applicable.

RELATED CO-PENDING U.S. PATENT APPLICATIONS

Not applicable.

FEDERALLY SPONSORED RESEARCH OR DEVELOPMENT

Not applicable.

REFERENCE TO SEQUENCE LISTING, A TABLE, OR A COMPUTER LISTING APPENDIX

Not applicable.

COPYRIGHT NOTICE

A portion of the disclosure of this patent document contains material that is subject to copyright protection by the author thereof. The copyright owner has no objection to the facsimile reproduction by anyone of the patent document or patent disclosure for the purposes of referencing as patent prior art, as it appears in the Patent and Trademark Office, patent file or records, but otherwise reserves all copyright rights whatsoever.

FIELD OF THE INVENTION

One or more embodiments of the invention generally relate to increasing the power output of solar panels. More particularly, certain embodiments of the invention relate to increasing the net power output of a photovoltaic (PV) solar panel while mitigating the increase in temperature of the solar panels.

BACKGROUND OF THE RELEVANT PRIOR ART

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

One of the chronic problems related to photovoltaic solar energy may be the increase in internal temperature of solar panels under continuous exposure to sunlight. Typically, the panel internal temperature rise may be in the range of 20° C. to 40° C. above an ambient temperature. This increase in temperature may lead to a loss of power output capability, i.e., the efficiency of the panel. It may be commonly accepted that the peak power output of high quality silicon solar panels drops about 0.5% per degree Celsius increase in temperature. It may be seen that solar panels may lose up to 20% of their rated power output capability due to natural heating under sunlight. If this loss of power output may be eliminated or reduced, a decrease in the cost per watt of electricity generated may result, which may make solar energy more commercially viable. In addition, the constant daily temperature cycling reduces the serviceable lifetime of solar panels.

Currently, methods to mitigate these problems have included the use of active heat removal methods such as forced air or water cooling, or thermoelectric cooling. These methods appear to have limited success because the methods may result in reducing net power output, increasing system cost and complexity, and/or degrading the overall system reliability.

In view of the foregoing, it is clear that these traditional techniques are not perfect and leave room for more optimal approaches.

BRIEF DESCRIPTION OF THE DRAWINGS

The present invention is illustrated by way of example, and not by way of limitation, in the figures of the accompanying drawings and in which like reference numerals refer to similar elements and in which.

Unless otherwise indicated illustrations in the figures are not necessarily drawn to scale.

DETAILED DESCRIPTION OF SOME EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

All words of approximation as used in the present disclosure and claims should be construed to mean "approximate," rather than "perfect," and may accordingly be employed as a meaningful modifier to any other word, specified parameter, quantity, quality, or concept. Words of approximation, include, yet are not limited to terms such as "substantial", "nearly", "almost", "about", "generally", "largely", "essentially", "closely approximate", etc.

As will be established in some detail below, it is well settle law, as early as 1939, that words of approximation are not indefinite in the claims even when such limits are not defined or specified in the specification.

For example, see *Ex parte Mallory*, 52 USPQ 297, 297 (Pat. Off. Bd. App. 1941) where the court said "The examiner has held that most of the claims are inaccurate because apparently the laminar film will not be entirely eliminated. The claims specify that the film is "substantially" eliminated and for the intended purpose, it is believed that the slight portion of the film which may remain is negligible. We are of the view, therefore, that the claims may be regarded as sufficiently accurate."

Note that claims need only "reasonably apprise those skilled in the art" as to their scope to satisfy the definiteness requirement. See *Energy Absorption Sys., Inc.* v. *Roadway Safety Servs., Inc.*, Civ. App. 96-1264, slip op. at 10 (Fed. Cir. Jul. 3, 1997) (unpublished) *Hybridtech* v. *Monoclonal Antibodies, Inc.*, 802 F.2d 1367, 1385, 231 USPQ 81, 94 (Fed. Cir. 1986), cert. denied, 480 U.S. 947 (1987). In addition, the use of modifiers in the claim, like "generally" and "substantial," does not by itself render the claims indefinite. See *Seattle Box Co.* v. *Industrial Crating & Packing, Inc.*, 731 F.2d 818, 828-29, 221 USPQ 568, 575-76 (Fed. Cir. 1984).

Moreover, the ordinary and customary meaning of terms like "substantially" includes "reasonably close to: nearly, almost, about", connoting a term of approximation. See *In re Frye*, Appeal No. 2009-006013, 94 USPQ2d 1072, 1077, 2010 WL 889747 (B.P.A.I. 2010) Depending on its usage, the word "substantially" can denote either language of approximation or language of magnitude. *Deering Precision Instruments, L.L.C.* v. *Vector Distribution Sys., Inc.*, 347 F.3d 1314, 1323 (Fed. Cir. 2003) (recognizing the "dual ordinary meaning of th[e] term ["substantially"] as connoting a term of approximation or a term of magnitude"). Here, when referring to the "substantially halfway" limitation, the Specification uses the word "approximately" as a substitute for the word "substantially" (Fact 4). (Fact 4). The ordinary meaning of "substantially halfway" is thus reasonably close to or nearly at the midpoint between the forward most point of the upper or outsole and the rearward most point of the upper or outsole.

Similarly, the term 'substantially' is well recognized in case law to have the dual ordinary meaning of connoting a term of approximation or a term of magnitude. See *Dana Corp.* v. *American Axle & Manufacturing, Inc.*, Civ. App. 04-1116, 2004 U.S. App. LEXIS 18265, *13-14 (Fed. Cir. Aug. 27, 2004) (unpublished). The term "substantially" is commonly used by claim drafters to indicate approximation. See *Cordis Corp.* v. *Medtronic AVE Inc.*, 339 F.3d 1352, 1360 (Fed. Cir. 2003) ("The patents do not set out any numerical standard by which to determine whether the thickness of the wall surface is 'substantially uniform.' The term 'substantially,' as used in this context, denotes approximation. Thus, the walls must be of largely or approximately uniform thickness."); see also *Deering Precision Instruments, LLC* v. *Vector Distribution Sys., Inc.*, 347 F.3d 1314, 1322 (Fed. Cir. 2003); *Epcon Gas Sys., Inc.* v. *Bauer Compressors, Inc.*, 279 F.3d 1022, 1031 (Fed. Cir. 2002). We find that the term "substantially" was used in just such a manner in the claims of the patents-in-suit: "substantially uniform wall thickness" denotes a wall thickness with approximate uniformity.

It should also be noted that such words of approximation as contemplated in the foregoing clearly limits the scope of claims such as saying 'generally parallel' such that the adverb 'generally' does not broaden the meaning of parallel. Accordingly, it is well settled that such words of approximation as contemplated in the foregoing (e.g., like the phrase 'generally parallel') envisions some amount of deviation from perfection (e.g., not exactly parallel), and that such words of approximation as contemplated in the foregoing are descriptive terms commonly used in patent claims to avoid a strict numerical boundary to the specified parameter. To the extent that the plain language of the claims relying on such words of approximation as contemplated in the foregoing are clear and uncontradicted by anything in the written description herein or the figures thereof, it is improper to rely upon the present written description, the figures, or the prosecution history to add limitations to any of the claim of the present invention with respect to such words of approximation as contemplated in the foregoing. That is, under such circumstances, relying on the written description and prosecution history to reject the ordinary and customary meanings of the words themselves is impermissible. See, for example, *Liquid Dynamics Corp.* v. *Vaughan Co.*, 355 F.3d 1361, 69 USPQ2d 1595, 1600-01 (Fed. Cir. 2004). The plain language of phrase 2 requires a "substantial helical flow." The term "substantial" is a meaningful modifier implying "approximate," rather than "perfect." In *Cordis Corp.* v. *Medtronic AVE, Inc.*, 339 F.3d 1352, 1361 (Fed. Cir. 2003), the district court imposed a precise numeric constraint on the term "substantially uniform thickness." We noted that the proper interpretation of this term was "of largely or approximately uniform thickness" unless something in the prosecution history imposed the "clear and unmistakable disclaimer" needed for narrowing beyond this simple-language interpretation. Id. In *Anchor Wall Systems* v. *Rockwood Retaining Walls, Inc.*, 340 F.3d 1298, 1311 (Fed. Cir. 2003)" Id. at 1311. Similarly, the plain language of Claim 1 requires neither a perfectly helical flow nor a flow that returns precisely to the center after one rotation (a limitation that arises only as a logical consequence of requiring a perfectly helical flow).

The reader should appreciate that case law generally recognizes a dual ordinary meaning of such words of approximation, as contemplated in the foregoing, as connoting a term of approximation or a term of magnitude; e.g., see *Deering Precision Instruments, L.L.C. v. Vector Distrib. Sys., Inc.,* 347 F.3d 1314, 68 USPQ2d 1716, 1721 (Fed. Cir. 2003), cert. denied, 124 S. Ct. 1426 (2004) where the court was asked to construe the meaning of the term "substantially" in a patent claim. Also see *Epcon,* 279 F.3d at 1031 ("The phrase 'substantially constant' denotes language of approximation, while the phrase 'substantially below' signifies language of magnitude, i.e., not insubstantial."). Also, see, e.g., *Epcon Gas Sys., Inc. v. Bauer Compressors, Inc.,* 279 F.3d 1022 (Fed. Cir. 2002) (construing the terms "substantially constant" and "substantially below"); *Zodiac Pool Care, Inc. v. Hoffinger Indus., Inc.,* 206 F.3d 1408 (Fed. Cir. 2000) (construing the term "substantially inward"); *York Prods., Inc. v. Cent. Tractor Farm & Family Ctr.,* 99 F.3d 1568 (Fed. Cir. 1996) (construing the term "substantially the entire height thereof"); *Tex. Instruments Inc. v. Cypress Semiconductor Corp.,* 90 F.3d 1558 (Fed. Cir. 1996) (construing the term "substantially in the common plane"). In conducting their analysis, the court instructed to begin with the ordinary meaning of the claim terms to one of ordinary skill in the art. *Prima Tek,* 318 F.3d at 1148. Reference to dictionaries and our cases indicates that the term "substantially" has numerous ordinary meanings. As the district court stated, "substantially" can mean "significantly" or "considerably." The term "substantially" can also mean "largely" or "essentially." Webster's New 20th Century Dictionary 1817 (1983).

Words of approximation, as contemplated in the foregoing, may also be used in phrases establishing approximate ranges or limits, where the end points are inclusive and approximate, not perfect; e.g., see *AK Steel Corp. v. Sollac,* 344 F.3d 1234, 68 USPQ2d 1280, 1285 (Fed. Cir. 2003) where it where the court said [W]e conclude that the ordinary meaning of the phrase "up to about 10%" includes the "about 10%" endpoint. As pointed out by AK Steel, when an object of the preposition "up to" is nonnumeric, the most natural meaning is to exclude the object (e.g., painting the wall up to the door). On the other hand, as pointed out by Sollac, when the object is a numerical limit, the normal meaning is to include that upper numerical limit (e.g., counting up to ten, seating capacity for up to seven passengers). Because we have here a numerical limit—"about 10%"—the ordinary meaning is that that endpoint is included.

In the present specification and claims, a goal of employment of such words of approximation, as contemplated in the foregoing, is to avoid a strict numerical boundary to the modified specified parameter, as sanctioned by *Pall Corp. v. Micron Separations, Inc.,* 66 F.3d 1211, 1217, 36 USPQ2d 1225, 1229 (Fed. Cir. 1995) where it states "It is well established that when the term "substantially" serves reasonably to describe the subject matter so that its scope would be understood by persons in the field of the invention, and to distinguish the claimed subject matter from the prior art, it is not indefinite." Likewise see *Verve LLC v. Crane Cams Inc.,* 311 F.3d 1116, 65 USPQ2d 1051, 1054 (Fed. Cir. 2002). Expressions such as "substantially" are used in patent documents when warranted by the nature of the invention, in order to accommodate the minor variations that may be appropriate to secure the invention. Such usage may well satisfy the charge to "particularly point out and distinctly claim" the invention, 35 U.S.C. § 112, and indeed may be necessary in order to provide the inventor with the benefit of his invention. In *Andrew Corp. v. Gabriel Elecs. Inc.,* 847 F.2d 819, 821-22, 6 USPQ2d 2010, 2013 (Fed. Cir. 1988) the court explained that usages such as "substantially equal" and "closely approximate" may serve to describe the invention with precision appropriate to the technology and without intruding on the prior art. The court again explained in *Ecolab Inc. v. Envirochem, Inc.,* 264 F.3d 1358, 1367, 60 USPQ2d 1173, 1179 (Fed. Cir. 2001) that "like the term 'about,' the term 'substantially' is a descriptive term commonly used in patent claims to 'avoid a strict numerical boundary to the specified parameter, see *Ecolab Inc. v. Envirochem Inc.,* 264 F.3d 1358, 60 USPQ2d 1173, 1179 (Fed. Cir. 2001) where the court found that the use of the term "substantially" to modify the term "uniform" does not render this phrase so unclear such that there is no means by which to ascertain the claim scope.

Similarly, other courts have noted that like the term "about," the term "substantially" is a descriptive term commonly used in patent claims to "avoid a strict numerical boundary to the specified parameter."; e.g., see *Pall Corp. v. Micron Seps.,* 66 F.3d 1211, 1217, 36 USPQ2d 1225, 1229 (Fed. Cir. 1995); see, e.g., *Andrew Corp. v. Gabriel Elecs. Inc.,* 847 F.2d 819, 821-22, 6 USPQ2d 2010, 2013 (Fed. Cir. 1988) (noting that terms such as "approach each other," "close to," "substantially equal," and "closely approximate" are ubiquitously used in patent claims and that such usages, when serving reasonably to describe the claimed subject matter to those of skill in the field of the invention, and to distinguish the claimed subject matter from the prior art, have been accepted in patent examination and upheld by the courts). In this case, "substantially" avoids the strict 100% nonuniformity boundary.

Indeed, the foregoing sanctioning of such words of approximation, as contemplated in the foregoing, has been established as early as 1939, see *Ex parte Mallory,* 52 USPQ 297, 297 (Pat. Off. Bd. App. 1941) where, for example, the court said "the claims specify that the film is "substantially" eliminated and for the intended purpose, it is believed that the slight portion of the film which may remain is negligible. We are of the view, therefore, that the claims may be regarded as sufficiently accurate." Similarly, *In re Hutchison,* 104 F.2d 829, 42 USPQ 90, 93 (C.C.P.A. 1939) the court said "It is realized that "substantial distance" is a relative and somewhat indefinite term, or phrase, but terms and phrases of this character are not uncommon in patents in cases where, according to the art involved, the meaning can be determined with reasonable clearness."

Hence, for at least the forgoing reason, Applicants submit that it is improper for any examiner to hold as indefinite any claims of the present patent that employ any words of approximation.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will be described in detail below with reference to embodiments thereof as illustrated in the accompanying drawings.

References to a "device," an "apparatus," a "system," etc., in the preamble of a claim should be construed broadly to mean "any structure meeting the claim terms" exempt for any specific structure(s)/type(s) that has/(have) been explicitly disavowed or excluded or admitted/implied as prior art in the present specification or incapable of enabling an object/aspect/goal of the invention. Furthermore, where the present specification discloses an object, aspect, function, goal, result, or advantage of the invention that a specific prior art structure and/or method step is similarly capable of performing yet in a very different way, the present invention disclosure is intended to and shall also implicitly include and cover additional corresponding alternative embodiments that are otherwise identical to that explicitly disclosed except that they exclude such prior art structure(s)/step(s), and shall accordingly be deemed as providing sufficient disclosure to support a corresponding negative limitation in a claim claiming such alternative embodiment(s), which exclude such very different prior art structure(s)/step(s) way(s).

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

References to "one embodiment," "an embodiment," "example embodiment," "various embodiments," "some embodiments," "embodiments of the invention," etc., may indicate that the embodiment(s) of the invention so described may include a particular feature, structure, or characteristic, but not every possible embodiment of the invention necessarily includes the particular feature, structure, or characteristic. Further, repeated use of the phrase "in one embodiment," or "in an exemplary embodiment," "an embodiment," do not necessarily refer to the same embodiment, although they may. Moreover, any use of phrases like "embodiments" in connection with "the invention" are never meant to characterize that all embodiments of the invention must include the particular feature, structure, or characteristic, and should instead be understood to mean "at least some embodiments of the invention" includes the stated particular feature, structure, or characteristic.

References to "user", or any similar term, as used herein, may mean a human or non-human user thereof. Moreover, "user", or any similar term, as used herein, unless expressly stipulated otherwise, is contemplated to mean users at any stage of the usage process, to include, without limitation, direct user(s), intermediate user(s), indirect user(s), and end user(s). The meaning of "user", or any similar term, as used herein, should not be otherwise inferred or induced by any pattern(s) of description, embodiments, examples, or referenced prior-art that may (or may not) be provided in the present patent.

References to "end user", or any similar term, as used herein, is generally intended to mean late stage user(s) as opposed to early stage user(s). Hence, it is contemplated that there may be a multiplicity of different types of "end user" near the end stage of the usage process. Where applicable, especially with respect to distribution channels of embodiments of the invention comprising consumed retail products/services thereof (as opposed to sellers/vendors or Original Equipment Manufacturers), examples of an "end user" may include, without limitation, a "consumer", "buyer", "customer", "purchaser", "shopper", "enjoyer", "viewer", or individual person or non-human thing benefiting in any way, directly or indirectly, from use of. or interaction, with some aspect of the present invention.

In some situations, some embodiments of the present invention may provide beneficial usage to more than one stage or type of usage in the foregoing usage process. In such cases where multiple embodiments targeting various stages of the usage process are described, references to "end user", or any similar term, as used therein, are generally intended to not include the user that is the furthest removed, in the foregoing usage process, from the final user therein of an embodiment of the present invention.

Where applicable, especially with respect to retail distribution channels of embodiments of the invention, intermediate user(s) may include, without limitation, any individual person or non-human thing benefiting in any way, directly or indirectly, from use of, or interaction with, some aspect of the present invention with respect to selling, vending, Original Equipment Manufacturing, marketing, merchandising, distributing, service providing, and the like thereof.

References to "person", "individual", "human", "a party", "animal", "creature", or any similar term, as used herein, even if the context or particular embodiment implies living user, maker, or participant, it should be understood that such characterizations are sole by way of example, and not limitation, in that it is contemplated that any such usage, making, or participation by a living entity in connection with making, using, and/or participating, in any way, with embodiments of the present invention may be substituted by such similar performed by a suitably configured non-living entity, to include, without limitation, automated machines, robots, humanoids, computational systems, information processing systems, artificially intelligent systems, and the like. It is further contemplated that those skilled in the art will readily recognize the practical situations where such living makers, users, and/or participants with embodiments of the present invention may be in whole, or in part, replaced with such non-living makers, users, and/or participants with embodiments of the present invention. Likewise, when those skilled in the art identify such practical situations where such living makers, users, and/or participants with embodiments of the present invention may be in whole, or in part, replaced with such non-living makers, it will be readily apparent in light of the teachings of the present invention how to adapt the described embodiments to be suitable for such non-living makers, users, and/or participants with embodiments of the present invention. Thus, the invention is thus to also cover all such modifications, equivalents, and alternatives falling within the spirit and scope of such adaptations and modifications, at least in part, for such non-living entities.

Headings provided herein are for convenience and are not to be taken as limiting the disclosure in any way.

The enumerated listing of items does not imply that any or all of the items are mutually exclusive, unless expressly specified otherwise.

It is understood that the use of specific component, device and/or parameter names are for example only and not meant to imply any limitations on the invention. The invention may thus be implemented with different nomenclature/terminology utilized to describe the mechanisms/units/structures/components/devices/parameters herein, without limitation. Each term utilized herein is to be given its broadest interpretation given the context in which that term is utilized.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "A memory controller comprising a system cache . . . ." Such a claim does not foreclose the memory controller from including additional components (e.g., a memory channel unit, a switch).

"Configured To." Various units, circuits, or other components may be described or claimed as "configured to" perform a task or tasks. In such contexts, "configured to" or "operable for" is used to connote structure by indicating that the mechanisms/units/circuits/components include structure (e.g., circuitry and/or mechanisms) that performs the task or tasks during operation. As such, the mechanisms/unit/circuit/component can be said to be configured to (or be operable) for perform(ing) the task even when the specified mechanisms/unit/circuit/component is not currently operational (e.g., is not on). The mechanisms/units/circuits/components used with the "configured to" or "operable for" language include hardware_ for example, mechanisms, structures, electronics, circuits, memory storing program instructions executable to implement the operation, etc. Reciting that a mechanism/unit/circuit/component is "configured to" or "operable for" perform(ing) one or more tasks is expressly intended not to invoke 35 U.S.C. .sctn. 112, sixth paragraph, for that mechanism/unit/circuit/component. "Configured to" may also include adapting a manufacturing process to fabricate devices or components that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

The terms "a", "an" and "the" mean "one or more", unless expressly specified otherwise.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" and "consisting of" limits the scope of a claim to the specified elements or method steps, plus those that do not materially affect the basis and novel characteristic(s) of the claimed subject matter (see *Norian Corp.* v *Stryker Corp.*, 363 F.3d 1321, 1331-32, 70 USPQ2d 1508, Fed. Cir. 2004). Moreover, for any claim of the present invention which claims an embodiment "consisting essentially of" or "consisting of" a certain set of elements of any herein described embodiment it shall be understood as obvious by those skilled in the art that the present invention also covers all possible varying scope variants of any described embodiment(s) that are each exclusively (i.e., "consisting essentially of") functional subsets or functional combination thereof such that each of these plurality of exclusive varying scope variants each consists essentially of any functional subset(s) and/or functional combination(s) of any set of elements of any described embodiment(s) to the exclusion of any others not set forth therein. That is, it is contemplated that it will be obvious to those skilled how to create a multiplicity of alternate embodiments of the present invention that simply consisting essentially of a certain functional combination of elements of any described embodiment(s) to the exclusion of any others not set forth therein, and the invention thus covers all such exclusive embodiments as if they were each described herein.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of", and thus, for the purposes of claim support and construction for "consisting of" format claims, such replacements operate to create yet other alternative embodiments "consisting essentially of" only the elements recited in the original "comprising" embodiment to the exclusion of all other elements.

Devices or system modules that are in at least general communication with each other need not be in continuous communication with each other, unless expressly specified otherwise. In addition, devices or system modules that are in at least general communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

The present invention will now be described in detail with reference to technologies and features incorporated in the exemplary embodiments.

The present invention may provide solutions for increasing the net power output of a photovoltaic (PV) solar panel by using an optimum fraction of the panel's own power to keep its temperature from increasing above ambient air temperature. A fundamental reason for the increase in the internal temperature of a solar panel may be the absorption of infrared radiation present in sunlight by the panel. The energy present in the infrared radiation cannot be converted to electricity. Instead, as it may be conducted through the panel, the panel's effective thermal resistance may cause its internal temperature to rise. If this infrared content may be efficiently pumped away, the problem of panel temperature rise and power loss may be mitigated.

While various types of heat pumps may be employed to control the panel temperature, a point to be considered may be the energy usage of the heat pump itself. Those skilled in the art, in light of the present teachings, will readily recognize that if the heat pump consumes more energy in the process of removing infrared radiation from the panel than the increase in energy resulting from maintaining the panel at a lower temperature, then there may be little net improvement in the total power generated by the system. In fact, in such an event, it may be more cost effective to not cool the panel.

A second impediment in solar panel cooling schemes may be the logistics of powering the heat pumps. Generally, an external power source may be required. This configuration may increase system cost and complexity, and may be particularly problematic in remote installations that lack an easy access to external power sources.

The present invention may provide solutions to address both problems described above. The conceptual ideas behind the techniques for these solutions are described below.

In order to remove heat, a heat pump may be employed to consume energy. The efficiency of a heat pump may be measured as a ratio of the amount of heat energy per unit time it removes to the amount of energy (typically electric energy) per unit time it consumes in doing so. This ratio may be commonly referred to as the Coefficient of Performance (COP). With a higher the COP, the heat pump may be more efficient.

In a hypothetical situation, consider a typical value of COP that maybe required of a heat pump in order to be a cost effective means of improving solar panel performance. Using previously stated assumptions of 20° C. increase in internal temperature of a panel, a 0.5% drop in power output per degree increase in temperature, a 20% efficiency solar cell, and 100 mW/cm2 of incoming solar radiation, the panel may lose about 2 mW/cm2 due to the increase in its internal temperature over ambient temperature.

Assuming further that about 40% of the incoming solar radiation may be infrared and may contribute to heating the panel, it may be estimated that a COP of about 20 may be required. Achieving this value may be a challenge. Indeed, from a perspective of refrigeration, the application where heat pumps may be typically employed, such high COP values may not be practically attainable. Under some constraining conditions, the COP may be dramatically increased. A consideration may be the heat load, i.e., the amount of heat energy the heat pump may expected to remove. COP may be a strong function of the heat load, increasing rapidly as the heat load decreases. The reason for this characteristic may be most conveniently understood for a thermoelectric (TE) heat pump. By way of an example, and without limitations, a TE heat pump may require a certain amount of electric current (I) to handle a given heat load. As the electrical current flows through the heat pump it may generates heat due to resistive effects. The self-generated heat may be proportional to the square of the electric current and may add to the burden on the heat pump, ultimately reducing the amount of useful heat removal and therefore lowering the COP. Similar considerations may also apply to other types of heat pumps.

Under low heat loads, the COP may increase exponentially. This assumption may be a factor supporting the present invention. Those skilled in the art, in light of the present teaching, may readily recognize that the heat load a solar panel is subjected to under natural sunlight may be low; for example, but without limitations, on the order of about 40 mW/cm$^2$. The heat load may arise mostly due to the infrared content in the solar spectrum. By extension, it may also be understandable, by one skilled in the art, in light of the present teaching, that the possibility of attaining the required high heat pump COP diminishes if the solar panel may be subjected to concentrated sunlight, e.g. by placement under an optical lens. Another consideration may be the temperature differential between the hot and cold sides of the heat pump. From fundamental thermodynamic principles, the maximum theoretically attainable COP of a heat pump is inversely proportional to the temperature difference between the hot and cold sides of the heat pump. This principle may be understood using a TE heat pump as an example, and without limitations. For large differences in temperature between the hot and cold sides of a TE cooling module, heat energy may flow back into the cold side conductively through the module itself, increasing the heat burden and thereby may lower the COP.

Furthermore, for TE heat pumps, the theoretical maximum COP is given by the expression:

$$COP_{max} = \left[\frac{T_C}{T_H - T_C}\right]\left(\frac{\sqrt{ZT+1} - \frac{T_H}{T_C}}{\sqrt{ZT+1} + 1}\right)$$

where TH is the hot side temperature and TC is the cold side temperature in Kelvin (degrees Celsius+273). From this equation it may be observed that if TH and TC are almost equal, then very high COP may be possible. This point constitutes the second factor supporting the present invention. By constraining the panel temperature to be close to the external air temperature, the possibility of attaining a high heat pump COP may be markedly enhanced.

The logistical complexity of having to operate the heat pump using external power sources may be resolved in the present invention by using a unique time-division technique that allows the panel's own power to be utilized in energizing the heat pump. An added advantage of this technique may be that there may not be an increase of the panel area requirement (e.g. as may happen if the heat pump were energized using separate dedicated solar panels). This point may be a factor in keeping the overall cost of solar energy low, given that high indirect costs associated with total panel area may be one of the reasons for the relatively high cost of solar energy compared to energy obtained from fossil fuels.

The features incorporated in the present invention are described below:

(a) A photovoltaic solar panel whose temperature may be controlled using an active heat pump (such as a plurality of thermoelectric cooling modules, aka Peltier cooling modules) which may be mechanically integrated with the panel and powered by the panel itself (i.e., an external power source may not be required).

(b) The configuration employed in the mechanical integration of the heat pump with the solar panel may include: the active heat pump consisting of an electrically and thermally conductive heat spreader layer placed under the solar cell, followed by a single or multiple layers of thermoelectric cooling modules placed under this heat spreader, followed by an active or passive heat sink under the thermoelectric modules. The entire assembly may be enclosed in a thermally insulating material to prevent or minimizing heat leakage through the sides.

(c) A time-division based switching system that may periodically diverts the solar cell's electrical power output to the heat pump from the load, with adjustable duty cycle.

(d) A smart, software defined control mechanism that may determine the optimal duty-cycle needed to maximize the net power output of the solar panel, using a variety of sensory inputs.

(e) The networking of the control electronics that may allow connectivity with the worldwide web and access to weather forecast information thereby allowing predictive control of the panel's performance.

The present invention will now be described in detail with reference to embodiments thereof as illustrated in the accompanying drawings.

Figure 1:
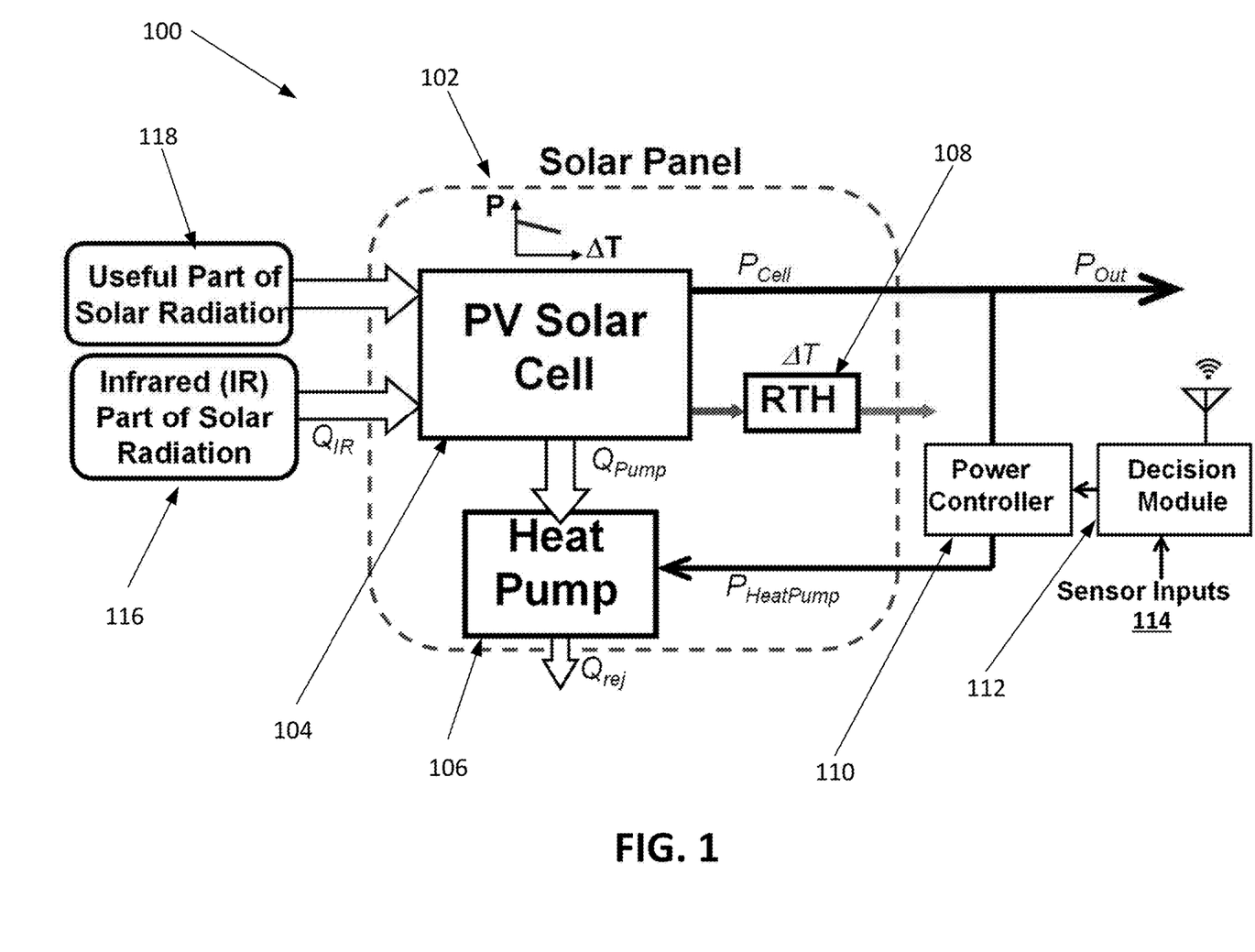
FIG. 1 illustrates an exemplary embodiment of a self-cooled photovoltaic solar panel structure formed by integrating a heat pump with the panel.

FIG. 1 illustrates an exemplary embodiment 100 of a self-cooled solar power system comprising solar panel 102 that comprises photovoltaic solar cells (PV cells). By way of example, and without limitations, PV cells may be specialized semiconductor diodes that may convert visible light into direct current (DC). Solar panel 102 may be formed by integrating a heat pump 106 and photovoltaic (PV) solar cell 104 in solar panel 102. As illustrated in the graph on FIG. 1, the power (P) of solar panel 102 may decline with a greater differential in temperature (ΔT) between the hot side and cold side of heat pump 106. Inputs to PV solar Cell 104 may include (1) a useful part of solar radiation 118 and (2) an infrared (IR) part of solar radiation 116, represented by $Q_{IR}$. PV solar cell 104 may generate an output $Q_{Pump}$ that may be coupled to heat pump 106. PV solar cell 104 may generate solar power signal, $P_{Cell}$, resulting in the solar cell power output, Pout. Solar panel 102's effective thermal resistance (RTH) 108 may be also illustrated in FIG. 1. A decision module 112 may receive sensors inputs 114 and may provide control information such, without limitation, as a control signal to power controller 110. As illustrated, decision module 112 may be capable of transmitting and receiving wireless signals. The power controller 110 also may receive solar power signal, $P_{Cell}$. Based on solar power signal $P_{Cell}$ and the control information from decision module 112, power controller 110 may generate signal $P_{HeatPump}$ that may be coupled to heat pump 106. Based on $Q_{Pump}$ and $P_{HeatPump}$, heat pump 106 may generate an output representing the rejected power $Q_{rej}$.

Exemplary embodiment 100 may maintain PV solar cell 104 at or near ambient air temperature (or external temperature) by diverting an optimal fraction of its own output power to heat pump 106. Without heat pump 106, the infrared (IR) part of solar radiation 116 in the incident sunlight may flow through solar panel 102's effective thermal resistance (RTH) 108 may cause a large increase in temperature inside solar panel 102. By way of an example, and without limitations, some novel aspects of the present invention lie in the physical construction of the solar panel 102 and the methods employed by the decision module 112 and power controller 110 to divert an optimum amount of power from the PV solar cell 104 to the heat pump 106 such that the net power delivered to the load may be maximized.

Decision module 112 may be designed to maximize or minimize certain objective functions such as the net power output of the panel, difference between panel internal temperature and external air temperature, etc. One particularly useful function may be the cost per watt (CPW) of electricity generated. This function may require programming several factors that may determine the CPW and also may determine sensitivity with respect to the optimizable variables such as the duty-cycle. This function may represent a high commercial feasibility point of a PV solar installation.

Figure 2A:
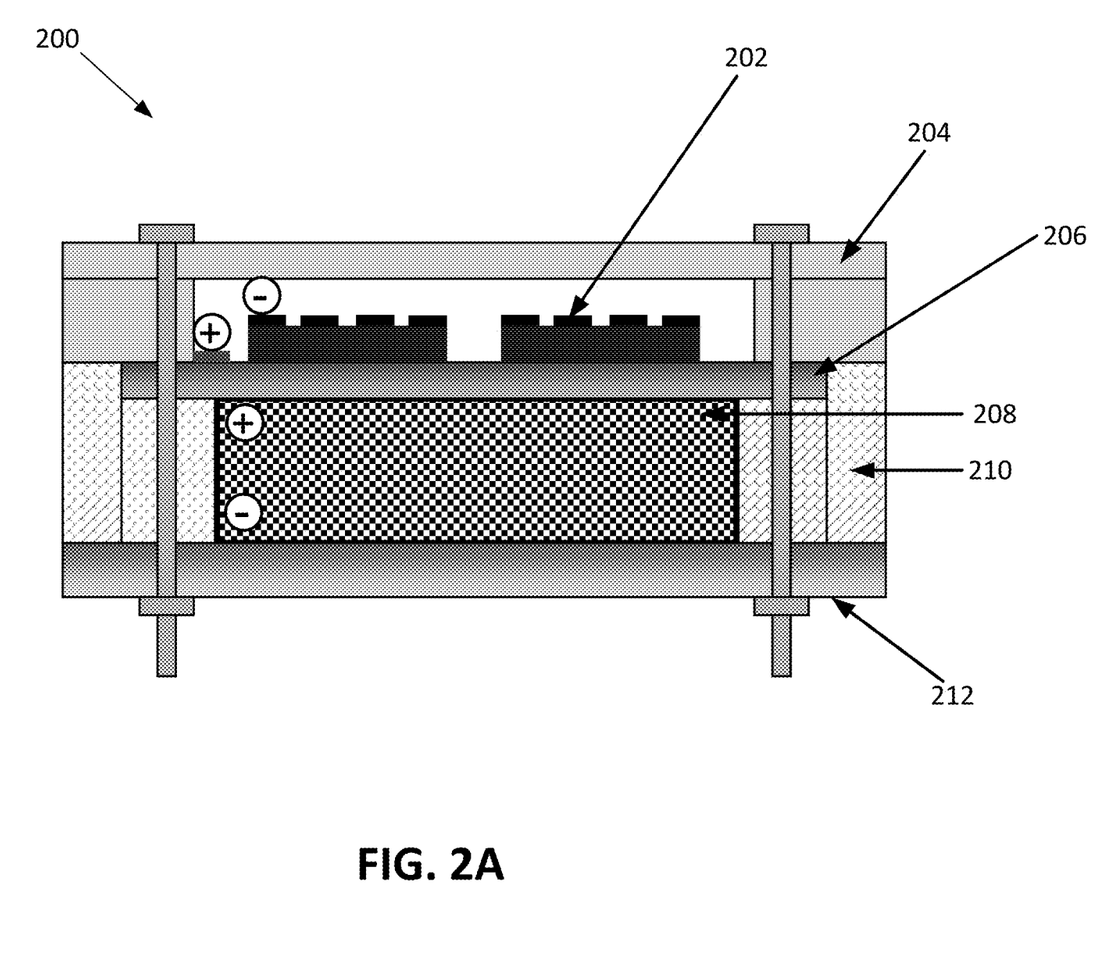
FIG. 2A illustrates an exemplary embodiment of a self-cooled photovoltaic solar panel assembly formed by integrating a generalized heat pump with the solar panel assembly.

FIG. 2A illustrates an exemplary embodiment 200 of a self-cooled photovoltaic solar panel assembly formed by integrating a generalized heat pump with the solar panel assembly. The self-cooled photovoltaic solar panel assembly may comprise PV solar cells 202, acrylic shield 204, heat spreader and upper assembly plate 206, heat pump 208, thermal insulation (Styrofoam) 210, and heat sink and lower assembly plate 212 (passive or active (e.g. liquid-cooled)). Heat Pump 208 may comprise a layer of heat pump cooling material. The "+" and "−" symbols indicate a positive terminal and negative terminal, respectively.

By way of example, and without limitations, some novel features that differentiate this construction from prior designs include: (a) the use of thermally conductive heat spreader material between the PV solar cells 202 and the heat pump 208 which allows efficient lateral heat flow, i.e., maximizing heat flow, (b) the use of thermal insulation (Styrofoam) 210 the sides to prevent or minimize lateral heat leakage, and (c) use of a passive or active heat sink 212 as the last bottom layer for efficient heat transfer, i.e., maximizing heat transfer, out of panel assembly.

Figure 2B:
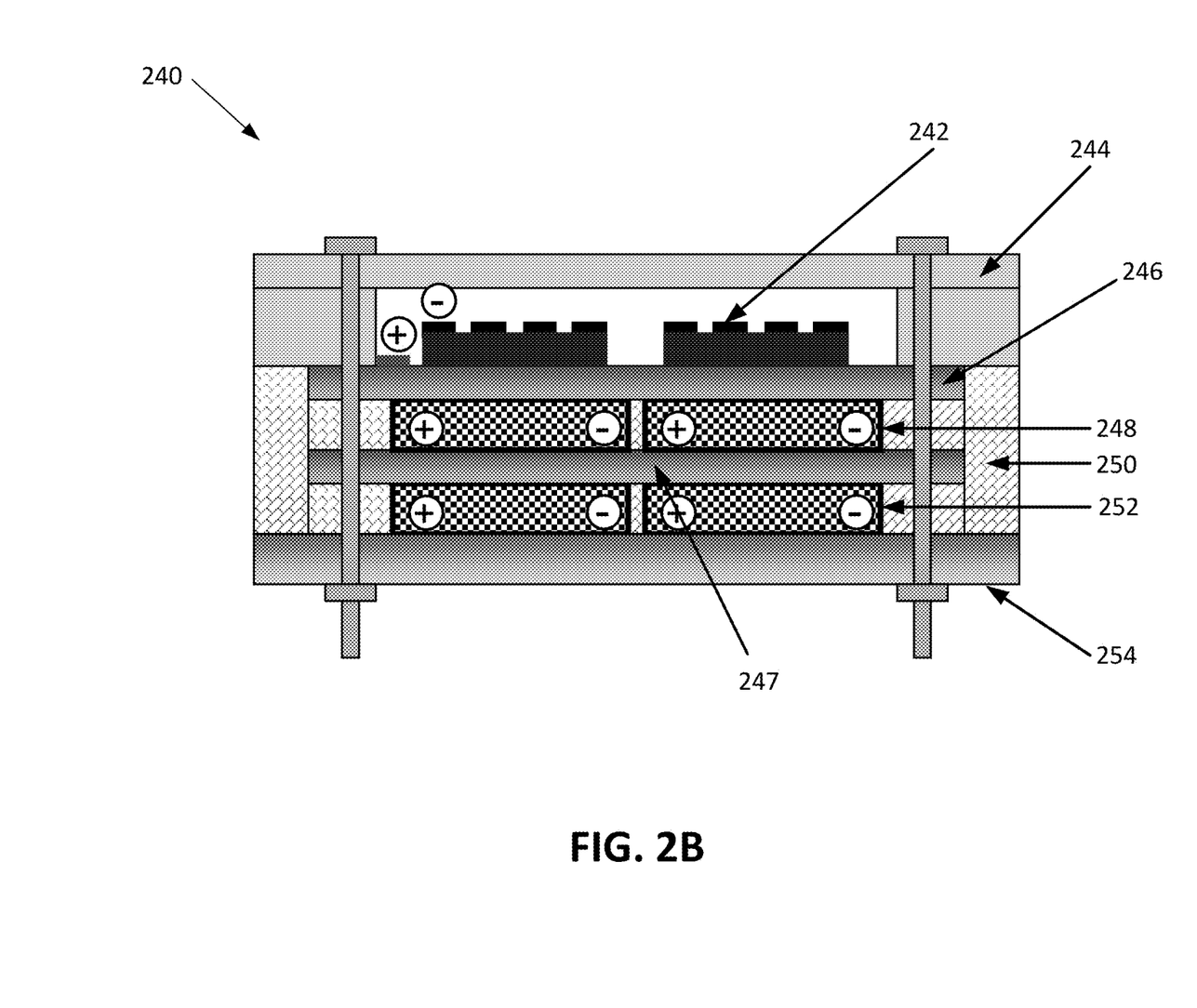
FIG. 2B illustrates an exemplary embodiment of a self-cooled photovoltaic solar panel assembly formed by integrating a thermoelectric heat pump with the solar panel assembly.

FIG. 2B illustrates an exemplary embodiment 240 of a self-cooled photovoltaic solar panel assembly formed by integrating a thermoelectric heat pump with the solar panel assembly. The self-cooled photovoltaic solar panel assembly may comprise PV solar cells 242, acrylic shield 244, heat spreader and upper assembly plate (copper) 246, TEC layer #1 248, thermal insulation 250 (Styrofoam), TEC layer #2 252, and heat sink and lower assembly plate 254 (passive or active (e.g. liquid-cooled)), and heat spreader 247. Thermoelectric cells (TE Cells) may be formed by components TEC layer #1 248, thermal insulation 250, TEC layer #2 252. TEC means thermoelectric cooling modules. The "+" and "−" symbols indicate a positive terminal and negative terminal, respectively.

As illustrated, the mechanical construction of the self-cooled solar panel of FIG. 2B may include TE Cells as the heat pump element. Those skilled in the art, in light of the present teachings, will readily recognize that a self-cooled solar panel based on TE Cells may provide preferred results as compared to the self-cooled solar panel with the generalized heat pump of FIG. 2A. A factor in the mechanical design may be the thermal coupling between the TE Cells and the PV solar cell 242 to insure that the best possible thermal contact between TE Cells and the PV solar cell 242 may be achieved. A difficulty obtaining the best possible contact may be that the surface of TE Cells may be composed of ceramic material to which a Si PV Cell cannot be thermally bonded. Additionally, the bottom surface of the PV solar cell 242 is its positive terminal and good electrical contact to the bottom surface may be essential. To work around these difficulties, the arrangement shown in FIG. 2B may be employed. The PV solar cell 242 may be soldered to a thin electrically and thermally conductive heat spreader and upper assembly plate (copper) 246. This heat spreader plate and a second thermally conductive plate which acts as a heat sink may be then clamped using high tension spring clamps with the TE Cells sandwiched between them. Multiple layers on TE Cells may be employed. FIG. 2B depicts two layers of TE Cells in use, although other exemplary embodiments may comprise more than two layers. Silver paste may be applied to both surfaces of the TE Cells to improve thermal coupling with the heat spreader and heat sink plates. Foam insulation may be placed between the TECs to ensure no heat entry from the edges. Good electrical contact may be made to the PV Cells. One method to accomplish this objective may be to bolt a thick gauge wire to the heat spreader plate on bottom side and by soldering a thick gauge wire to the metal grid on the top side of the PV solar cell 242.

FIG. 2A and FIG. 2B illustrate two embodiments of mechanical integration of a heat pump and a solar panel. The concept may be extended to a mechanical integration of a heat pump with another functional element that requires a transfer of heat energy from a source of heat to a destination called a "heat sink". This may include, but not limited to: space heating and cooling needs (HVAC), water heating, and district heating (extracts heat from a body of water).

Figure 3:
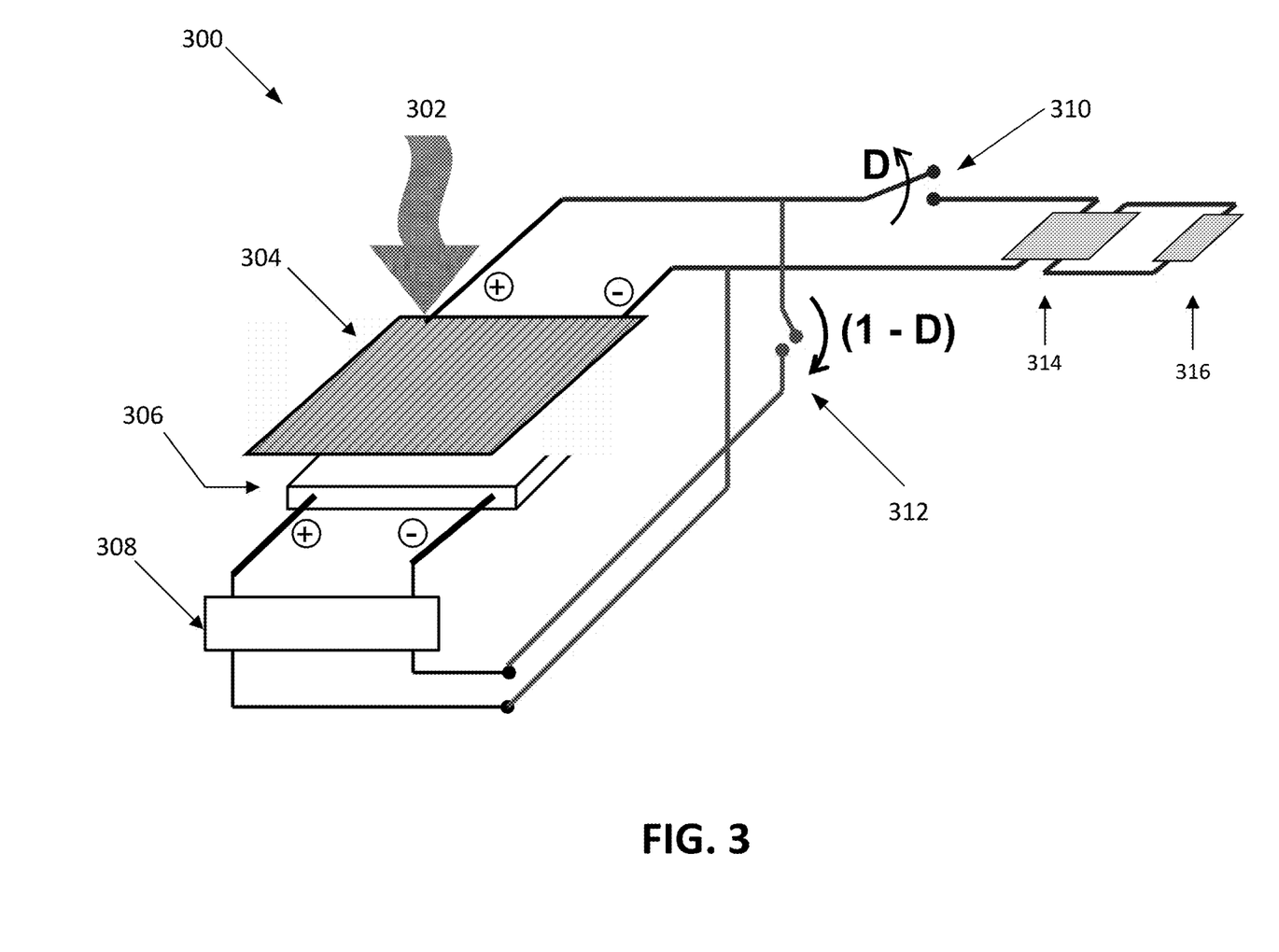
FIG. 3 illustrates an exemplary embodiment of an electrical implementation of a self-cooled solar cell.

FIG. 3 illustrates an exemplary embodiment 300 of an electrical implementation of self-cooling mechanism as employed in the present invention. As illustrated, sunlight 302 illuminates solar panel 304. The positive and negative terminals of solar panel 304 may be coupled to one pair of ports of a power conditioner 314, with the positive terminal being coupled via switch S1 310. Another pair of ports of power conditioner 314 may be coupled to load 316. Heat pump 306 may be located proximate to solar panel 304. The positive and negative terminals of heat pump 306 may be coupled to one pair of ports of impedance matching circuitry 308. Each of the other pair of ports of impedance matching circuitry 308 may be coupled to either the positive terminal of solar panel 304 via switch S2 312, or coupled to the negative terminal. The "+" and "−" symbols indicate a positive terminal and negative terminal, respectively.

Those skilled in the art, in light of the present teachings, will readily recognize that self-cooling may be conceptually implemented by diverting a small portion of the solar panel 304's own power to heat pump 306 that may be integrated mechanically with solar panel 304. For purposes of this discussion it may be assumed that heat pump 306 may be realized using TE Cells. In practice, other types of heat pumps may be employed. In many practical applications, power diversion may be realized, by way of example, and without limitations, and according to the teachings of the present embodiment, by employing a time-division technique with a switching circuit, as illustrated by way of example in FIG. 3. An element of this implementation may be the pair of switches, switch S1 310 and switch S2 312. As discussed herein, switch S1 310 may be referred to as "S1" and switch S2 312 may be referred to as "S2".

The switches oscillate may between two states. In State #1, S1 may be closed, S2 may be open. In State #2, S1 may be open, S2 may be closed. In State #1 solar panel 304 powers the real load. In State #2, solar panel 304 powers the heat pump 306. In actual usage, the system may remain in State #1 for the majority of the time, flipping to State #2 momentarily during which time the solar panel 304 may be cooled by heat pump 306. In this manner, the power from solar panel 304 may be time-shared between the electrical load and the cooling unit. Flipping from State #1 to State #2 may happen at a fixed frequency. During each switching cycle, the fraction of time period in State #1 relative to the fraction of time period in State #2 may be called the "duty cycle" (D). 100% duty cycle may imply that the solar panel 304 may be constantly supplying the true load and no power may be being diverted to the cooling unit. Likewise, 50% duty cycle implies S1 may be closed and the true load may be powered for half the switching time period while S2 may be closed and the cooling unit may be powered for the other half of the switching period. The further the duty cycle may fall from 100%, when more power is diverted away from the load 316 to the heat pump 306. While diverting more power to the heat pump 306 reduces the power available for the true load, it may also increase the total power delivered by solar panel 304 by lowering the internal panel temperature. There may be two opposing factors at play and there may be an optimal value of the duty-cycle at which the net power output of solar panel 304 may be maximized. This optimal value of the duty cycle may be determined by the decision module 112 shown in FIG. 1. Decision module 112 may utilize sensors inputs 114, such as the internal panel temperature, ambient air temperature, panel output voltage and current, humidity, etc. and may use a built-in algorithm to determine the optimal duty-cycle value. This optimal duty-cycle value may be then converted to an electrical signal by the power controller 110 shown in FIG. 1. The decision module 112 may also connected to the worldwide web which may allow it to access weather forecast information and use this information in determining the optimal duty-cycle. The switching system may be a synchronous switching system or an asynchronous switching.

In summary, by way of an example, and without limitations, FIGS. 1, 2, 3 describe a method and apparatus for increasing power output of solar panel 102 using adaptive self-cooling. For any net power gain, the operation of the described structural unit may be controlled optimally. Heat pump 106 may be powered using a tightly controlled fraction of the PV Cell's power. This control mechanism may be embodied in power controller 110 and decision module 112 shown in FIG. 1. A novel programmable electronic switching circuitry may be employed in power controller 110 that (a) allows for instantaneously changing the amount of electrical power diverted from the PV Cells to the heat pump 106, and (b) impedance matches the PV solar cell 104 and heat pump 106 electrically so that maximum power may be delivered from the PV solar cell 104 to the heat pump 106. Decision module 112 drives the power controller 110 may use a uniquely designed smart microcontroller that takes as inputs various items such as PV cell temperature, outside air temperature, wind speed, weather forecast, etc. Decision module 112 may then use these inputs in conjunction with information about the electrical and thermal models of the PV solar cell 104 and heat pump 106 that may be pre-programmed into it, to determine the most optimum amount of power to divert from the PV solar cell 104 to the heat pump 106 so that the net power gain may be maximized.

Some unique aspects of the present invention may be derived from the following point: From fundamental thermodynamics, the efficiency of heat pumps may increase rapidly as the temperature difference between the hot and cold sides may be reduced. Therefore, the control mechanism aims to keep the aPV Cell's temperature at or around ambient air temperature, i.e., there may be no attempt to chill the PV cell below ambient or to maintain it at some fixed temperature. Programmable electronic circuitry may be employed to match the PV solar cell 104 and heat pump 106 electrically so that a maximum power may be delivered from the PV solar cell 104 and heat pump 106.

The extension to networked and IoT applications, especially in remote and standalone environments, may be further elaborated in the following manner. In these applications, the energy required to operate the devices may often be harvested from the environment using elements such as solar cells, piezo or thermoelectric generators, RF transducers etc. Certain embodiments of the present invention may be used to improve power management features of such systems where, for example, supply voltage and not CPW may be of prime concern. In such circumstances the decision module 112 may be programmed to improve output voltage by lowering the temperature of the power generator by adjusting duty cycle, at the cost of efficiency.

As previously noted, embodiments of the present invention may include the features of 1) a time-division based switching system with an adjustable duty cycle to manage an output, 2) a smart software defined control mechanism, capable of determining an optimal duty cycle based on sensory inputs and 3) a network controlled electronics that may allow predictive control. A combination of these features may be incorporated in other embodiments to determine and/or optimize outputs based on a variety of inputs. These other embodiments may operate in a network environment. Examples may include, and without limitations, applications for the internet of things (IoT), such as smart home, smart city, smart grids, industrial internet, connected car, connected health, smart retail, smart supply chain, smart farming and wearables. Other embodiments may include applications where a reasonable precise feedback system requiring rapid changes or responses (e.g. milliseconds) based on various inputs.

Figure 4:
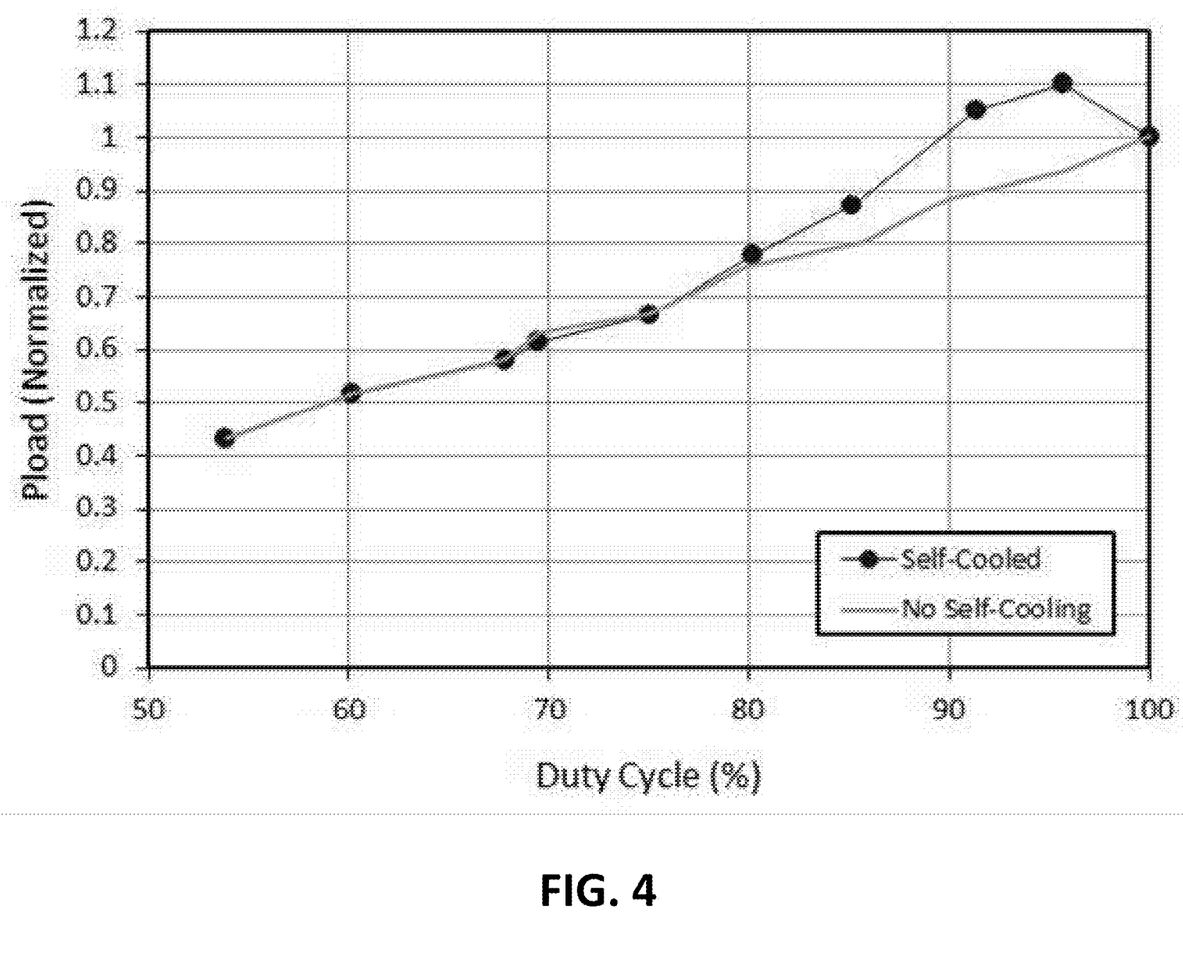
FIG. 4 illustrates a representative power output versus duty cycle for a thermoelectric self-cooling solar cell for an embodiment of the present invention.

Experiments have been conducted to examine the power output versus duty cycle for solar cells with and without self-cooling. FIG. 4 graphically illustrates the results of the experiment. Power delivered to the load is shown on a normalized basis. As observed, there may be a general linear relation between power and duty cycle. As the duty cycle is lowered slightly from 100%, the power output of the cell may increase. With further decreases in duty cycle, the power output may begin to drop. At around 90% duty cycle the advantage from self-cooling may drop to zero. At the peak output, which occurs at about 96% duty cycle, the solar cell output with self-cooling may be about 10.25% higher than without self-cooling.

Figure 5:
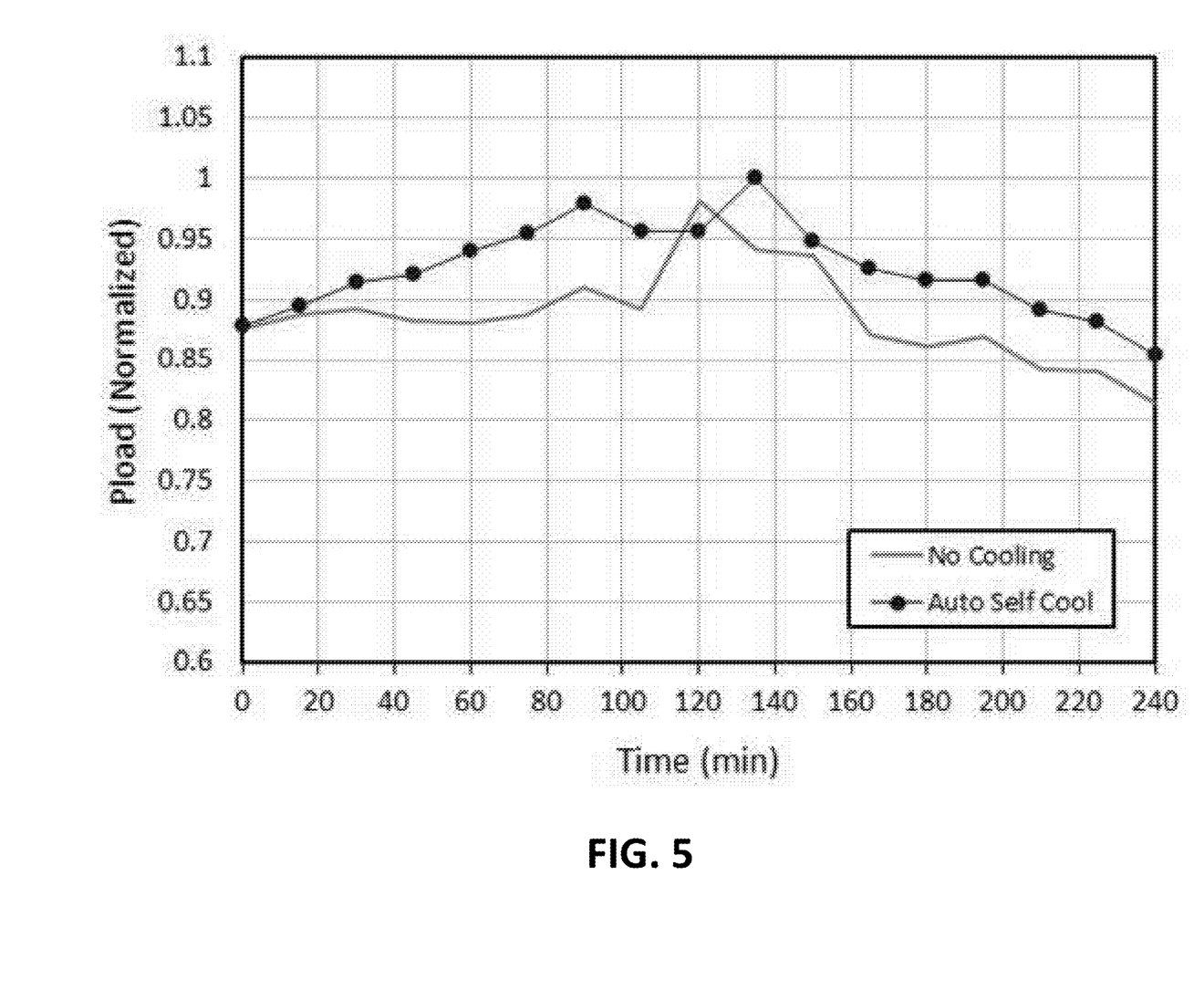
FIG. 5 illustrates a representative power output of a thermoelectric self-cooling solar cell with auto adjusted duty cycle for an embodiment of the present invention.

Experiments have been conducted to examine impact of an auto adjusted duty cycle. FIG. 5 illustrates the experimental results for the power output of a thermoelectric self-cooling solar cell with auto adjusted duty cycle. Power to the load are shown on a normalized basis. The results presented are for the case where the solar cell operates autonomously, i.e., the solar cell may adjust the switching duty cycle automatically depending on the difference between the temperatures sensed at the cell itself and the ambient air. The experiment was conducted under natural sunlight with the cell in auto adjusting self-cooling mode. Measurements were recorded every 15 minutes from 11:00 am to 3:00 pm. For comparison, the same measurements were repeated without self-cooling. FIG. 5 shows the results. It may be observed from the results that the self-cooled cell may produce more power at almost all time points compared to the cell with no cooling. As the air temperature increased, there was a drop in the open circuit voltage; but because of the simultaneous increase in sun angle, the short circuit current also increased. Because of these two opposite effects, the overall variation in power output over the four hour measurement period was quite uniform. The self-cooled cell produced more power consistently as compared with the cell without cooling.

Those skilled in the art will readily recognize, in light of and in accordance with the teachings of the present invention, that any of the foregoing steps may be suitably replaced, reordered, removed and additional steps may be inserted depending upon the needs of the particular application. Moreover, the prescribed method steps of the foregoing embodiments may be implemented using any physical and/or hardware system that those skilled in the art will readily know is suitable in light of the foregoing teachings. For any method steps described in the present application that can be carried out on a computing machine, a typical computer system can, when appropriately configured or designed, serve as a computer system in which those aspects of the invention may be embodied. Thus, the present invention is not limited to any particular tangible means of implementation.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

It is noted that according to USA law 35 USC § 112 (1), all claims must be supported by sufficient disclosure in the present patent specification, and any material known to those skilled in the art need not be explicitly disclosed. However, 35 USC § 112 (6) requires that structures corresponding to functional limitations interpreted under 35 USC § 112 (6) must be explicitly disclosed in the patent specification. Moreover, the USPTO's Examination policy of initially treating and searching prior art under the broadest interpretation of a "mean for" claim limitation implies that the broadest initial search on 112(6) functional limitation would have to be conducted to support a legally valid Examination on that USPTO policy for broadest interpretation of "mean for" claims. Accordingly, the USPTO will have discovered a multiplicity of prior art documents including disclosure of specific structures and elements which are suitable to act as corresponding structures to satisfy all functional limitations in the below claims that are interpreted under 35 USC § 112 (6) when such corresponding structures are not explicitly disclosed in the foregoing patent specification. Therefore, for any invention element(s)/structure(s) corresponding to functional claim limitation(s), in the below claims interpreted under 35 USC § 112 (6), which is/are not explicitly disclosed in the foregoing patent specification, yet do exist in the patent and/or non-patent documents found during the course of USPTO searching, Applicant(s) incorporate all such functionally corresponding structures and related enabling material herein by reference for the purpose of providing explicit structures that implement the functional means claimed. Applicant(s) request(s) that fact finders during any claims construction proceedings and/or examination of patent allowability properly identify and incorporate only the portions of each of these documents discovered during the broadest interpretation search of 35 USC § 112 (6) limitation, which exist in at least one of the patent and/or non-patent documents found during the course of normal USPTO searching and or supplied to the USPTO during prosecution. Applicant(s) also incorporate by reference the bibliographic citation information to identify all such documents comprising functionally corresponding structures and related enabling material as listed in any PTO Form-892 or likewise any information disclosure statements (IDS) entered into the present patent application by the USPTO or Applicant(s) or any $3^{rd}$ parties. Applicant(s) also reserve its right to later amend the present application to explicitly include citations to such documents and/or explicitly include the functionally corresponding structures which were incorporate by reference above.

Thus, for any invention element(s)/structure(s) corresponding to functional claim limitation(s), in the below claims, that are interpreted under 35 USC § 112 (6), which is/are not explicitly disclosed in the foregoing patent specification, Applicant(s) have explicitly prescribed which documents and material to include the otherwise missing disclosure, and have prescribed exactly which portions of such patent and/or non-patent documents should be incorporated by such reference for the purpose of satisfying the disclosure requirements of 35 USC § 112 (6). Applicant(s) note that all the identified documents above which are incorporated by reference to satisfy 35 USC § 112 (6) necessarily have a filing and/or publication date prior to that of the instant application, and thus are valid prior documents to incorporated by reference in the instant application.

Having fully described at least one embodiment of the present invention, other equivalent or alternative methods of implementing methods and apparatus to increase in the power output of solar panels according to the present invention will be apparent to those skilled in the art. Various aspects of the invention have been described above by way of illustration, and the specific embodiments disclosed are not intended to limit the invention to the particular forms disclosed. The particular implementation of the methods and apparatus to increase in the power output of solar panels may vary depending upon the particular context or application. By way of example, and without limitations, the methods and apparatus to increase in the power output of solar panels described in the foregoing were principally directed to solar energy implementations; however, similar techniques may instead be applied to a variety of internet of things (IoT) applications, which implementations of the present invention are contemplated as within the scope of the present invention. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

Claim elements and steps herein may have been numbered and/or lettered solely as an aid in readability and understanding. Any such numbering and lettering in itself is not intended to and should not be taken to indicate the ordering of elements and/or steps in the claims.

The corresponding structures, materials, acts, and equivalents of all means or step plus function elements in the claims below are intended to include any structure, material, or act for performing the function in combination with other claimed elements as specifically claimed.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The Abstract is provided to comply with 37 C.F.R. Section 1.72(b) requiring an abstract that will allow the reader to ascertain the nature and gist of the technical disclosure. That is, the Abstract is provided merely to introduce certain concepts and not to identify any or essential features of the claimed subject matter. It is submitted with the understanding that it will not be used to limit or interpret the scope or meaning of the claims.

The following claims are hereby incorporated into the detailed description, with each claim standing on its own as a separate embodiment.

What is claimed is:

1. A system comprising:
    a photovoltaic solar panel comprising a plurality of photovoltaic solar cells integrated with a heat pump;
    a power controller configured to control said heat pump based on receiving a solar power signal from said plurality of photovoltaic solar cells and a control signal from a decision module;
    said decision module being configured to adjust a duty cycle to divert power of said plurality of photovoltaic solar cells from an electrical load to said heat pump based on one or more sensory inputs and/or one or more algorithms; and
    in which said heat pump being configured to generate a rejected power output based on said duty cycle and another output from said plurality of photovoltaic solar cells.

2. The system as recited in claim 1, in which said decision module being configured to adjust said duty cycle based on a difference between an internal temperature of said photovoltaic solar panel and an external temperature.

3. The system as recited in claim 1, in which said decision module being configured to adjust said duty cycle based on a cost per watt (CPW) parameter.

4. The system as recited in claim 1, in which said decision module being configured to adjust said duty cycle based on maximizing a net power output of said photovoltaic solar panel.

5. The system as recited in claim 1, wherein, said decision module is connected to a worldwide web, and wherein said one or more sensory inputs comprises inputs received from said worldwide web.

6. The system as recited in claim 1, in which a frequency of said photovoltaic solar panel switches between powering said electrical load to powering said heat pump is a fixed frequency.

7. A system comprising:
a photovoltaic solar panel comprising photovoltaic solar cells and a heat pump;
a first switch and a second switch being operable to switch between a first state and a second state;
a controller being configured to adjust a duty cycle of said first switch and said second switch based on one or more sensory inputs and/or algorithms; and
in which for said first state, said photovoltaic solar cells power an electrical load, and for said second state, said photovoltaic solar cells power said heat pump.

8. The system as recited in claim 7, in which said controller adjusts the duty cycle in order to maximize a net power output of said photovoltaic solar panel.

9. The system as recited in claim 7, in which switching from said first state to said second state occurs at a fixed frequency.

10. The system as recited in claim 7, in which said duty cycle represents a fraction of a time period for said first state relative to a fraction of a time period for said second state.

11. The system as recited in claim 7, in which said photovoltaic solar panel being configured for self-cooling by diverting a portion of power of said photovoltaic solar panel to said heat pump.

12. The system as recited in claim 7, wherein, said one or more sensory inputs comprise weather forecast information, internal panel temperature, ambient air temperature, panel output voltage and current and humidity.

* * * * *